US012696638B2

(12) United States Patent
Choi et al.

(10) Patent No.: US 12,696,638 B2
(45) Date of Patent: Jul. 28, 2026

(54) DISPLAY PANEL AND DISPLAY DEVICE INCLUDING THE SAME

(71) Applicant: LG Display Co., Ltd., Seoul (KR)

(72) Inventors: Joung Mi Choi, Paju-si (KR); Eui Hyun Chung, Paju-si (KR); Ji Ah Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 402 days.

(21) Appl. No.: 18/212,157

(22) Filed: Jun. 20, 2023

(65) Prior Publication Data

US 2024/0431158 A1 Dec. 26, 2024

(30) Foreign Application Priority Data

Aug. 4, 2022 (KR) ........................ 10-2022-0097185

(51) Int. Cl.
*G09G 3/32* (2016.01)
*H10K 59/131* (2023.01)

(52) U.S. Cl.
CPC .................................. *H10K 59/131* (2023.02)

(58) Field of Classification Search
CPC ......... H10K 59/131; G09G 2300/0426; G09G 2300/0842; G09G 2310/0218; G09G 2310/027; G09G 2310/0286; G09G 2310/066; G09G 2310/08; G09G 2320/0233; G09G 2320/0295; G09G 3/3233; G09G 3/3266; G09G 3/3291; B01J 8/00; B01J 8/006; B01J 8/008; F02P 7/0675; G06F 12/1009; G06F 12/14; G06F 12/1441; G06F 12/1483; G06F 12/1491
See application file for complete search history.

(56) References Cited

U.S. PATENT DOCUMENTS

| | | | |
|---|---|---|---|
| 9,853,097 B2 | 12/2017 | Kim et al. | |
| 2016/0217728 A1* | 7/2016 | In ........................ | G09G 3/2096 |
| 2017/0154944 A1 | 6/2017 | Kim et al. | |
| 2019/0027096 A1 | 1/2019 | Kim et al. | |
| 2020/0111413 A1 | 4/2020 | Park et al. | |

FOREIGN PATENT DOCUMENTS

| | | |
|---|---|---|
| KR | 10-2017-0062603 A | 6/2017 |
| KR | 10-2017-0062647 A | 6/2017 |
| KR | 10-2019-0010052 A | 1/2019 |
| KR | 10-2019-0079487 A | 7/2019 |
| KR | 10-2020-0040332 A | 4/2020 |

OTHER PUBLICATIONS

Ministry of Intellectual Property of Korea, Office Action, Korean Patent Application No. 10-2022-0097185 A, Jan. 5, 2026, 11 pages.

* cited by examiner

*Primary Examiner* — Insa Sadio
(74) *Attorney, Agent, or Firm* — Fenwick & West LLP

(57) ABSTRACT

A display panel and a display device including the same are disclosed. The display panel includes a pixel array on which an input image is displayed; and a bezel area outside the pixel array. The pixel array includes a pixel circuit area in which a plurality of pixel circuits connected to data lines, gate lines, and power lines are disposed; and a gate driving circuit area in which a gate driver supplying a gate signal to the gate line is disposed. A light emitting area of a light emitting element driven by the pixel circuits is disposed in the pixel circuit area and the gate driving circuit area. The power line is disposed below an anode electrode of the light emitting element.

19 Claims, 8 Drawing Sheets

DISPLAY PANEL AND DISPLAY DEVICE INCLUDING THE SAME

CROSS-REFERENCE TO RELATED APPLICATION

This application claims priority to and the benefit of Republic of Korea Patent Application No. 10-2022-0097185, filed Aug. 4, 2022, which is hereby incorporated herein by reference in its entirety.

BACKGROUND

1. Field

The present disclosure relates to a display panel and a wearable display device including the display panel.

2. Discussion of Related Art

Electroluminescence display devices may be divided into inorganic light-emitting display devices and organic light-emitting displays according to a material of an emission layer. An active matrix organic light-emitting display device includes an organic light-emitting diode (OLED) that generates light by itself and has advantages in terms of a high response rate, high luminous efficiency, high luminance, and a large viewing angle. In an organic light-emitting display device, the OLED is formed at each pixel. The organic light-emitting display device has a high response rate, high luminous efficiency, high luminance, and a large viewing angle and is capable of expressing black gradation in perfect or near perfect black, thereby achieving a high contrast ratio and a high color reproduction rate.

SUMMARY

Display panels of organic light emitting display devices are applied to various types of wearable display devices. Various attempts have been made to reduce a narrow bezel in a display panel of a wearable display device, but it is difficult to design the narrow bezel. When an internal compensation circuit is applied to the pixels, gate signals are increased. In this case, since a gate driving circuit disposed in the outer bezel area of the display panel becomes large, the design of the narrow bezel becomes more difficult.

The present disclosure is directed to solving the aforementioned needs and/or problems.

The present disclosure provides a display panel and a wearable display device including the display panel.

It should be noted that objects of the present disclosure are not limited to the above-described objects, and other objects of the present disclosure will be apparent to those skilled in the art from the following descriptions.

A display panel according to one embodiment of the present disclosure may include a pixel array on which an input image is displayed; and a bezel area outside the pixel array. The pixel array may include a pixel circuit area in which a plurality of pixel circuits connected to data lines, gate lines, and power lines are disposed; and a gate driving circuit area in which a gate driver supplying a gate signal to the gate line is disposed. A light emitting area of a light emitting element driven by the pixel circuits may be disposed in the pixel circuit area and the gate driving circuit area. The power line may be disposed below an anode electrode of the light emitting element.

A red light emitting area in which an anode electrode of a red light emitting element is disposed, a green light emitting area in which an anode electrode of a green light emitting element is disposed, and a blue light emitting area in which an anode electrode of a blue light emitting element is disposed may be disposed between the gate driving circuit area and the pixel circuit area.

The display panel may further include a first planarization layer configured to cover the gate driver and the pixel circuit, and a second planarization layer configured to cover the first planarization layer. The power line may be overlapped with the gate driver and the pixel circuit with the first planarization layer interposed therebetween, and may be overlapped with the anode electrode with the second planarization layer interposed therebetween.

The display panel may further include a metal pattern connected to a transistor of the pixel circuit through a contact hole penetrating the first planarization layer and connected to the anode electrode through a contact hole penetrating the second planarization layer. The power line and the metal pattern may be spaced apart from each other on the first planarization layer. Each of signal transfer parts of the gate driver includes a first control node connected to a gate electrode of a pull-up transistor, a second control node connected to a gate electrode of a pull-down transistor, and an output node connected to the gate line. The power line may be overlapped with the gate driver in the gate driving circuit area with the first planarization layer interposed therebetween, and may be overlapped with the pixel circuit in the pixel circuit area with the first planarization layer interposed therebetween.

The display panel may further include a first planarization layer configured to cover the gate driver and the pixel circuit, and a second planarization layer configured to cover the first planarization layer. The power line may include a first power line disposed in the gate driving circuit area, overlapped with the gate driver with the first planarization layer interposed therebetween, and overlapped with the anode electrode with the second planarization layer interposed therebetween, and a second power line having a line width smaller than that of the first power line and disposed in the pixel circuit area and overlapped with the pixel circuit with the first planarization layer interposed therebetween.

Each of signal transfer parts of the gate driver may include a first control node connected to a gate electrode of a pull-up transistor, a second control node connected to a gate electrode of a pull-down transistor, and an output node connected to the gate line. The first planarization layer may cover the first control node, the second control node, and the output node. The second planarization layer may cover the power line. The anode electrode may be disposed on the second planarization layer. The power line may be overlapped with the first control node, the second control node, and the output node with the first planarization layer interposed therebetween in the gate driving circuit area, and may be overlapped with the anode electrode with the second planarization layer interposed therebetween.

The display panel may further include a metal pattern connected to a transistor of the pixel circuit through a contact hole penetrating the first planarization layer and connected to the anode electrode through a contact hole penetrating the second planarization layer. The power line and the metal pattern are spaced apart from each other on the first planarization layer.

The display panel may further include a demultiplexer array connected to the data line, and a data link part connected to the input terminal of the demultiplexer. The demultiplexer array and the data link part are disposed at a corner part of the display panel without the gate driver.

A wearable display device according to one embodiment of the present disclosure may comprises a display panel configured to include a pixel circuit area in which a plurality of pixel circuits connected to a data line, a gate line, and a power line are disposed, a gate driving circuit area in which a gate driver supplying a gate signal to the gate line is disposed, and a demultiplexer array connected to the data line, and a data link part connected to the input terminal of the demultiplexer; and a drive IC connected to the data link part and the gate driver. A light emitting area of a light emitting element driven by the pixel circuits may be disposed in the pixel circuit area and the gate driving circuit area. The power line may be disposed below an anode electrode of the light emitting element.

According to the present disclosure, a bezel of a wearable display device may be reduced by embedding a gate driver in a pixel array of a display panel.

According to the present disclosure, a path through which an electric field generated due to a voltage fluctuation generated from a gate driver below a power line is transmitted to a light emitting element may be blocked by disposing the power line below an anode electrode of a light emitting element. As a result, when the gate driver is disposed in the pixel array, the electric field from the gate driver does not affect the light emitting device, so that stable image quality may be realized throughout the pixel array.

According to the present disclosure, a power line and a planarization layer are disposed below an anode electrode of a light emitting device to increase the degree of flatness of the anode electrode, thereby improving a difference in light reflection visibility depending on the viewing angle.

Effects which can be achieved by the present disclosure are not limited to the above-mentioned effects. That is, other objects that are not mentioned may be obviously understood by those skilled in the art to which the present disclosure pertains from the following description.

It is to be understood that both the foregoing general description and the following detailed description are exemplary and explanatory and are intended to provide further explanation of the inventive concepts as claimed.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which:

FIG. 10 is an enlarged plan view of a part of a display panel according to another exemplary embodiment of the present disclosure; and FIG. 11 is a cross-sectional view showing a cross-sectional structure of a pixel circuit area and a gate driving circuit area shown in FIG. 10 according to an exemplary embodiment of the present disclosure.

Figure 1:
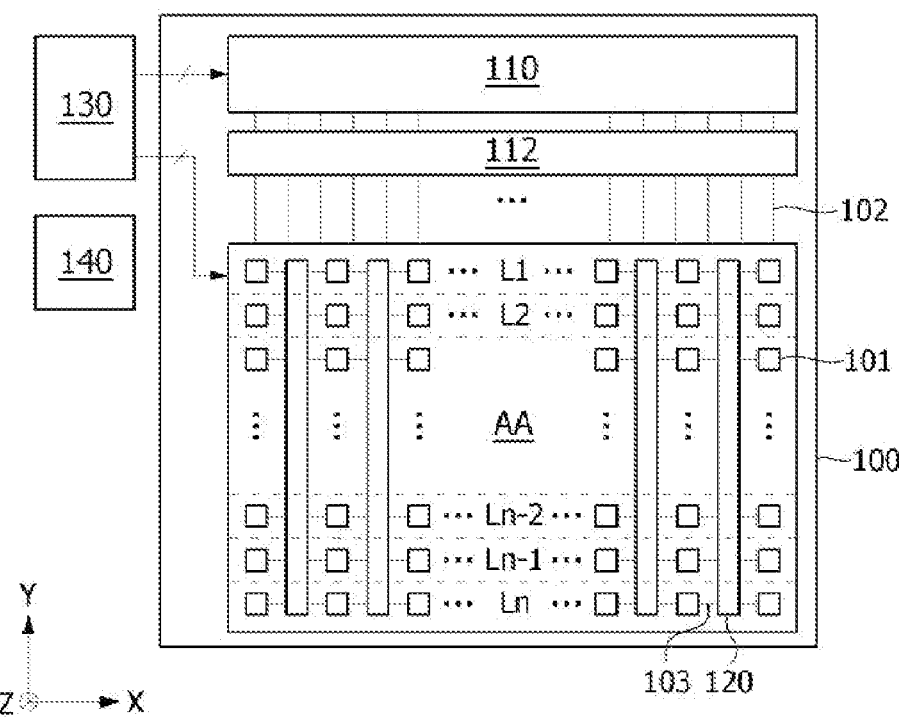
FIG. 1 is a block diagram showing a display device according to one exemplary embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Names of the respective elements used in the following explanations may be selected only for convenience of writing the specification and may be thus different from those used in actual products.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure. Any implementation described herein as an "example" is not necessarily to be construed as preferred or advantageous over other implementations.

The terms such as "comprising," "including," "having," and "comprising" used herein are generally intended to allow other components to be added unless the terms are used with the term "only." Any references to singular may include plural unless expressly stated otherwise.

Components are interpreted to include an ordinary error range even if not expressly stated.

When a positional or interconnected relationship is described between two components, such as "on top of," "above," "below," "next to," "connect or couple with," "crossing," "intersecting," or the like, one or more other components may be interposed between them, unless "immediately" or "directly" is used.

When a temporal antecedent relationship is described, such as "after", "following", "next to", "before", or the like, it may not be continuous on a time base unless "immediately" or "directly" is used.

The terms, such as "below," "lower," "above," "upper" and the like, may be used herein to describe a relationship between element(s) as illustrated in the drawings. It will be understood that the terms are spatially relative and based on the orientation depicted in the drawings.

The terms "first," "second," "A," "B," "(a)," and "(b)," and the like may be used to distinguish components from each other, but the functions or structures of the components are not limited by ordinal numbers or component names in front of the components.

The term "at least one" should be understood as including any and all combinations of one or more of the associated listed items. For example, the meaning of "at least one of a first item, a second item, and a third item" encompasses the combination of all three listed elements, combinations of any two of the three elements, as well as each individual element, the first element, the second element, and the third element.

The following embodiments can be partially or entirely bonded to or combined with each other and can be linked and operated in technically various ways. The embodiments can be carried out independently of or in association with each other.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

In a display panel, a pixel may include a plurality of sub-pixels, for example, having different colors for color implementation. The sub-pixel may include a pixel circuit including a switch element and a driving element to drive a light emitting element. The switch element and the driving element are implemented with transistors of a thin film transistor (TFT) structure.

In the display device of the present disclosure, the pixel circuit and the gate driver include transistors such as an oxide TFT including an oxide semiconductor, a LTPS TFT including low temperature poly silicon (LTPS), or TFT including other semiconductors such as amorphous silicon and compound semiconductor etc.

A transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor (e.g., p-channel metal-oxide semiconductor (PMOS)), since carriers are holes, a source voltage is higher than a drain voltage such that holes may flow from a source to a drain. In the p-channel transistor, since holes flow from the source to the drain, a current flows from the source to the drain. It should be noted that a source and a drain of a transistor are not fixed. For example, a source and a drain may be changed according to an applied voltage. Therefore, the disclosure is not limited due to a source and a drain of a transistor. In the following description, a source and a drain of a transistor will be referred to as a first electrode and a second electrode.

A gate signal may be configured to swing between a gate-on voltage and a gate-off voltage. A transistor is turned on in response to the gate-on voltage, while it is turned off in response to the gate-off voltage. In the case of an n-channel transistor, the gate-on voltage may be a gate-high voltage, and the gate-off voltage may be a gate-low voltage. In the case of a p-channel transistor, the gate-on voltage may be the gate-low voltage and the gate-off voltage may be the gate-high voltage.

Hereinafter, various embodiments of the present disclosure will be described in detail with reference to the accompanying drawings.

Figure 2:
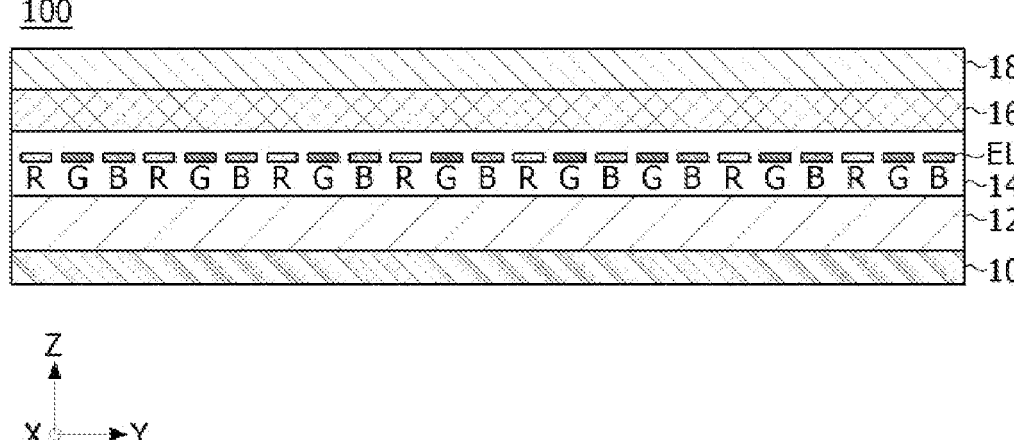
FIG. 2 is a cross-sectional view schematically showing a cross-sectional structure of the display panel shown in FIG. 1 according to an exemplary embodiment of the present disclosure.

Referring to FIGS. 1 and 2, a display device according to an exemplary embodiment of the present disclosure includes a display panel 100, a display panel driver for writing pixel data to pixels of the display panel 100, and a power supply 140 generating power necessary for driving the pixels and the display panel driver. All the components of each display device according to all embodiments of the present disclosure are operatively coupled and configured.

The display panel 100 may have a rectangular structure having a length in an X-axis direction, a width in a Y-axis direction, and a thickness in a Z-axis direction, without being limited thereto. As an example, the display panel 100 may have a rectangular structure having a length in a Y-axis direction, a width in a X-axis direction, or even other structure such as a square structure, a round structure, a triangle structure, an oval structure, a polygonal structure etc. The display panel 100 includes a pixel array AA that displays an input image on a screen. The pixel array AA may include a plurality of data lines 102, a plurality of gate lines 103 intersecting the data lines 102, and pixels disposed in an area defined by the data lines 102 and the gate lines 103 in a matrix form. The display panel 100 may further include power lines commonly connected to the pixels. The power lines supply the pixels 101 with a constant voltage necessary for driving the pixels 101. For example, the display panel 100 may include a power line to which a pixel driving voltage ELVDD is applied, a power line to which a low potential power voltage ELVSS is applied, and the like.

FIG. 2 is a cross-sectional view schematically showing a cross-sectional structure of the display panel shown in FIG.

1. The cross-sectional structure of the display panel 100 may at least include a circuit layer 12, a light emitting element layer 14, and an encapsulation layer 16 stacked on a substrate 10, and a touch sensor layer 18. For convenience of description, the above-mentioned layers are shown in FIG. 2, but the display panel 100 may include more layers such buffer layer, active layer, insulating layers, passivation layer and the like.

The circuit layer 12 may at least include a circuit element such as a TFT array including a pixel circuit connected to wirings, such as the data line, the gate line, and the power line, etc., a demultiplexer array 112, a gate driver 120, or the like. The wirings and circuit elements of the circuit layer may include a plurality of insulating layers, two or more metal layers separated from one another with the insulating layer(s) therebetween, and an active layer including a semiconductor material (e.g., polycrystalline semiconductor material or oxide semiconductor material).

The light emitting element layer 14 may include light emitting elements EL configured to be driven by the pixel circuit. The light emitting elements EL may include a red light emitting element, a green light emitting element, and a blue light emitting element. But embodiments are not limited thereto. As an example, the light emitting elements EL may further include a white light emitting element. As another example, the light emitting elements EL may include light emitting elements of different combination of colors, such as cyan, magenta, and yellow. In another embodiment, the light emitting element layer 14 may include a white light emitting element and a color filter. The light emitting elements EL of the light emitting element layer 14 may be covered with a protective layer, such as a multi-layered protective layer including an organic film and an inorganic film or a single layer protective layer.

The light emitting element EL may be implemented with an OLED, without being limited thereto. As an example, the light emitting element EL may be implemented with a LED or micro-LED, etc. The OLED includes an organic compound layer as light emitting layer formed between an anode electrode and a cathode electrode. The organic compound layer may include an emission layer (EML). As an example, the organic compound layer may further include at least one of a hole injection layer (HIL), a hole transport layer (HTL), an electron transport layer (ETL), and an electron injection layer, (EIL), but is not limited thereto. When a voltage is applied to the anode and cathode electrodes of the OLED, holes (e.g., holes passing through the hole transport layer (HTL)) and electrons (e.g., electrons passing through the electron transport layer (ETL)) may be moved to the light emitting layer (EML) to form excitons. In this case, visible light is emitted from the light emitting layer (EML). As an example, the OLED used as a light emitting element EL may have a tandem structure in which a plurality of light emitting layers are stacked. The OLEDs with the tandem structure may improve the luminance and lifetime of pixels. The light-emitting element EL may further include a color filter array that selectively transmits light of red, green, and blue wavelengths.

The encapsulation layer 16 covers the light emitting element layer 14. As an example, the encapsulation layer 16 may seal the circuit layer 12 and the light emitting element layer 14. The encapsulation layer 16 may have a multi-layer insulating film structure in which an organic film and an inorganic film are alternately stacked or a single layer insulating film structure. For example, the inorganic encapsulation layer, for example, can be made of an inorganic insulating material such as silicon nitride SiNx, silicon oxide SiOx, silicon oxynitride SiON or aluminum oxide $Al_2O_3$, which can be deposited at a low temperature, and the organic encapsulation layer PCL, for example, can be made of an organic insulating material such as an acrylic resin, an epoxy resin, polyimide, polyethylene, silicon oxycarbon SiOC, or the like. The inorganic film may block the penetration of moisture and oxygen. The organic film may planarize the surface of the inorganic film. When the organic film and the inorganic film are stacked in multiple layers, the movement path of moisture or oxygen becomes longer than that in a single layer, so that the penetration of moisture and oxygen affecting the light emitting element layer 14 may be effectively blocked or reduced.

A touch sensor layer 18 may be optionally formed on the encapsulation layer 16. As an example, a polarizing plate or a color filter layer may be further disposed thereon. The touch sensor layer 18 may include capacitive touch sensors that sense a touch input based on a change in capacitance before and after the touch input. The touch sensor layer 18 may include insulating films and metal wiring patterns that form the capacitance of the touch sensors. The insulating films may insulate intersecting portions in the metal wiring patterns and/or may planarize the surface of the touch sensor layer 18. As another example, a sensing electrode and lines of the touch sensor layer 18 may be made of a transparent material such as indium tin oxide (ITO) or a metal mesh, thereby increasing light transmittance. The polarizing plate may improve visibility and contrast ratio by converting the polarization of light (e.g., external light) reflected by the metal of the circuit layer 12 and/or the touch sensor layer 18, for example, the polarizing plate may reduce the reflection of light from a surface of the display panel 100 and block the light reflected from metal of the circuit layer 12, thereby improving the brightness of the pixels. The polarizing plate may be implemented as a circular polarizing plate or a polarizing plate in which a linear polarizing plate and a phase retardation film are bonded. A cover glass may be bonded to the polarizing plate. The color filter layer may include red, green, and/or blue color filters, etc. The color filter layer may further include a black matrix pattern. The color filter layer may absorb a part of the wavelength of light reflected from the circuit layer 12 and the touch sensor layer 18 and increase the color purity of an image reproduced in the pixel array AA. As an example, the color filter layer may replace the polarizing plate. At least one of the touch sensor layer 18, the polarizing plate, the cover glass and the color filter layer may be omitted as necessary.

The pixel array AA may include a plurality of pixel lines L1 to Ln. Each of the pixel lines L1 to Ln includes pixels of one line arranged along a line direction (X-axis direction) in the pixel array AA of the display panel 100. As an example, at least some of the pixels arranged in one pixel line may share a gate line 103. As an example, the gate lines 103 may extend along the line direction (X-axis direction). As an example, at least some of the sub-pixels arranged in a column direction Y along a data line direction may share the same data line 102. One horizontal period may be a time period obtained by dividing one frame period by the total number of the pixel lines L1 to Ln, without being limited thereto.

Each of the pixels 101 may be divided into a red sub-pixel, a green sub-pixel, and a blue sub-pixel to implement different colors. But embodiments are not limited thereto. For example, sub-pixels of different combination of colors in one pixel are also possible. Although not shown in the drawings, each of the pixels may further include a white sub-pixel. Each of the sub-pixels may include the pixel circuit and a light-emitting element (e.g., organic light-emitting diode: OLED). Hereinafter, a "pixel" may be interpreted as having the same meaning as a sub-pixel. Each pixel circuit may be connected to the data line, the gate lines, and/or the power lines.

The pixels may be arranged as real color pixels and/or pentile pixels. A pentile pixel may realize a higher resolution than a real color pixel by driving two sub-pixels having different colors as one pixel 101 by using a preset pixel rendering algorithm. The pixel rendering algorithm may compensate for insufficient color representation (e.g., luminance and/or color) in each pixel with the color of light emitted from an adjacent pixel.

The power supply 140 may generate a direct current (DC) voltage or constant voltage, such as the gamma reference voltage, the gate-off voltage VGH/VEH, the gate-on voltage VGL/VEL, a pixel driving voltage ELVDD, a low-potential power voltage ELVSS, an initialization voltage Vini, a reference voltage Vref, for driving the pixel array AA of the display panel 100 and the display panel driver, for example, by using a DC-DC converter. The DC-DC converter may include a charge pump, a regulator, a buck converter, a boost converter, and/or the like. For example, the power supply 140 may adjust the level of a DC input voltage, for example, applied from a host system not shown in the drawings to generate constant voltages such as a gamma reference voltage VGMA, gate-on voltages, gate-off voltages, the pixel driving voltage, the low potential power voltage, and/or the like. The gamma reference voltage is supplied to a data driver 110. The gate-on voltages and the gate-off voltages may be supplied to the gate driver 120. The constant voltages, such as the pixel driving voltage, the low potential power voltage, and the like may be supplied to the pixels 101 through the power lines (e.g., commonly) connected to the pixels 101. The constant voltages applied to the pixel circuit may have different voltage levels.

The display panel driver may write pixel data of an input image to the pixels of the display panel 100 under the control of the timing controller 130.

The display panel driver may at least include the data driver 110 and the gate driver 120. As an example, the display panel driver may further include a demultiplexer array 112 disposed between the data driver 110 and the data lines 102.

The demultiplexer array 112 may sequentially supply the data voltages outputted from the channels of the data driver 110 to the data lines 102 using a plurality of demultiplexers. The demultiplexers may include a plurality of switch elements disposed on the display panel 100. When the demultiplexer is disposed between the data lines 102 and the output terminals of the data driver 110, the number of channels of the data driver 110 may be reduced. For example, the demultiplexer 112 may time-divisionally distribute the data voltage Vdata output through the channels of the data driver 110 to the plurality of data lines DL. However, the present disclosure is not necessarily limited thereto, and the demultiplexer 112 may be omitted.

Figure 4:
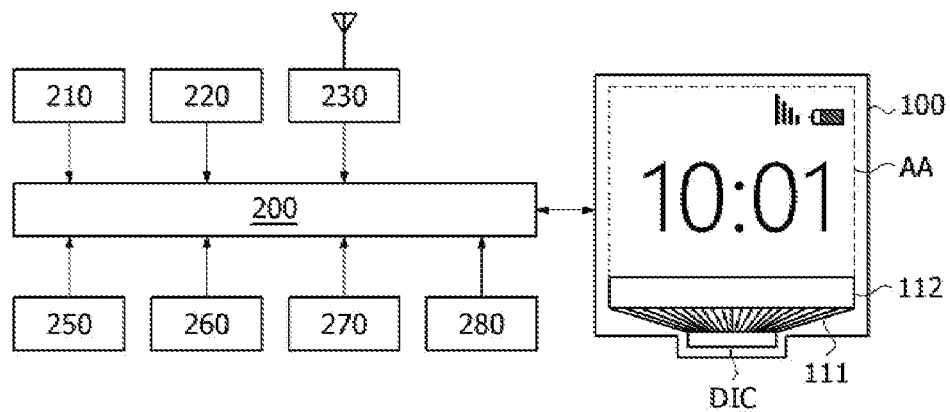
FIG. 4 is a block diagram showing a wearable display device according to an exemplary embodiment of the present disclosure.

The display panel driver may further include a touch sensor driver for driving the touch sensors. The touch sensor driver is not illustrated in FIG. 1. In a wearable display device, the data driver 110, the timing controller 130, the power supply 140, and/or the like may be integrated into one drive integrated circuit DIC as shown in FIG. 4. As an example, the drive IC DIC may be bonded to a bezel area outside the pixel array on the display panel 100 to drive the pixel array AA. The drive IC DIC may supply the data voltages of pixel data to wirings of a data link part. The data voltage supplied to the data link part is supplied to the data line of the pixel array AA through the demultiplexer array 112. A gate timing control signal outputted from the drive IC DIC is supplied to the gate driver 120 (e.g., the gate driver 120 in the pixel array AA) to control the gate driver 120.

The data driver 110 may receive the pixel data of the input image received as a digital signal from the timing controller 130 and may output a data voltage. The channels of the data driver 110 include a digital to analog converter (DAC). The DAC converts the pixel data to be written to the pixels into a gamma compensation voltage to generate a data voltage Vdata. The gamma reference voltage VGMA inputted to the DAC may be divided into a gamma compensation voltage for each gray scale through a voltage divider circuit. The gamma compensation voltage may be provided to the DAC of the data driver 110. The data voltage Vdata may be outputted from each of the channels of the data driver 110 through an output buffer.

As an example, the gate driver 120 may be disposed in the pixel array AA together with the pixel circuit, for example, the gate driver 120 may be implemented as a gate-in-panel (GIP) circuit formed directly in a bezel area BZ on the display panel 100 together with a TFT array of the pixel array. The gate driver 120 may sequentially output the gate signal to the gate lines 103 under the control of the timing controller 130. The gate driver 120 may shift the gate signal by using a shift register to sequentially supply the gate signal to the gate lines 103. Since the gate driver 120 is embedded in the pixel array AA where the input image is reproduced, bezel areas such as left and right bezel areas, which are non-display areas, in the display panel 100 may be reduced or minimized.

The host system may be a system controller of the wearable display device. The host system may scale an image signal from a video source to fit the resolution of the display panel 100 and transmit it to the timing controller 130 together with the timing signal. For example, the host system may be a main circuit board of a television system, a camera, a set-top box, a navigation system, a personal computer (PC), a vehicle system, a home theater system, a mobile device, or a wearable device.

The timing controller 130 may generate a data timing control signal for controlling the operation timing of the data driver 110, a control signal for controlling the operation timing of the demultiplexer array 112, and/or a gate timing control signal for controlling the operation timing of the gate driver 120. The timing controller 130 may control the operation timing of the display panel driver to synchronize the data driver 110, the demultiplexer array 112, the touch sensor driver, and/or the gate driver 120. For example, the timing controller 130 may receive the pixel data of the input image and a timing signal synchronized with the pixel data from a host system. The timing signal may include a vertical synchronization signal Vsync, a horizontal synchronization signal Hsync, a clock CLK, a data enable signal DE, and the like.

The gate timing control signal generated from the timing controller 130 may be inputted to the shift register of the gate driver 120 through a level shifter omitted in FIG. 1. The level shifter may receive the gate timing control signal to generate a start pulse and a shift clock and may provide the start pulse and the shift clock to the shift register of the gate driver 120.

Figure 3:
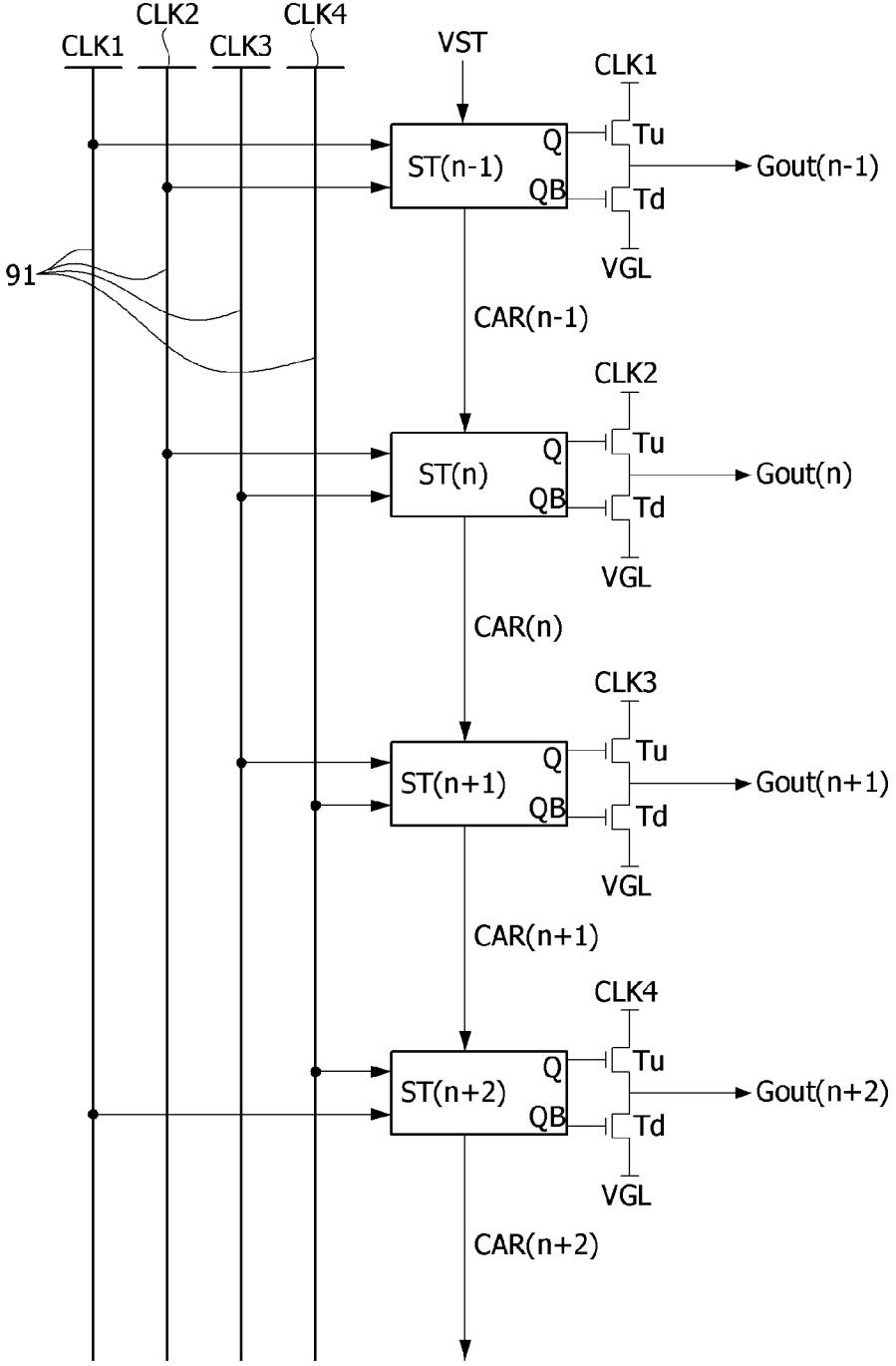
FIG. 3 is a block diagram schematically showing a gate driver shown in FIG. 1 according to an exemplary embodiment of the present disclosure.

FIG. 3 is a block diagram schematically showing the gate driver 120 according to one embodiment.

Referring to FIG. 3, the gate driver 120 sequentially outputs gate pulses Gout(n−1) to Gout(n+2) using a shift register. The shift register includes signal transfer parts ST(n−1) to ST(n+2) that are cascaded.

The signal transfer parts ST(n−1) to ST(n+2) are commonly connected to clock lines 91 to which shift clocks CLK1 to CLK4 are applied. The signal transfer parts ST(n−1) to ST(n+2) are connected in cascade through a carry line to which carry pulses CAR(n−1) to CAR(n+2) is applied.

Each of the signal transfer parts ST(n−1) to ST(n+2) includes a VST node to which a start pulse VST or one of carry pulses CAR(n−1) to CAR(n+1) is inputted, a CLK node to which one of shift clocks CLK1 to CLK4 is inputted, a first output node from which one of gate pulses Gout(n−1) to Gout(n+2) is outputted, and a second output node from which one of carry pulses CAR(n−1) to CAR(n+2) is outputted. The first output node through which the gate pulse is outputted is connected to the gate line of the display panel. The gate pulses Gout(n−1) to Gout(n+2) and the carry pulses CAR(n−1) to CAR(n+2) may be outputted through a common output node. In this case, the second output node and the first output node may be connected to one common output node. However, the present disclosure is not necessarily limited thereto, the second output node and the first output node may be connected to different output nodes.

A start pulse VST is generally inputted to the first signal transfer part. In the example of FIG. 3, the n−1th signal transfer part ST(n−1) may be a first signal transfer part. The shift clocks CLK1 to CLK4 may be 4-phase clocks in which phases are sequentially shifted, but are not limited thereto. For example, the shift clocks CLK1 to CLK4 may be M-phase clocks where M is a positive integer greater than or equal to 2.

The signal transfer parts ST(n) to ST(n+2) connected in cascade to the n−1th signal transfer part ST(n−1) receive the carry pulses CAR(n−1) to CAR(n+2) from previous signal transfer parts as start pulse and start to drive. Each of the signal transfer parts ST(n−1) to ST(n+2) outputs the gate pulses Gout(n−1) to Gout(n+2) through the first output node and simultaneously outputs the carry pulses CAR(n−1) to CAR(n+2) through the second output node.

Each of the signal transfer parts ST(n−1) to ST(n+2) includes a first control node Q, a second control node QB, and a buffer circuit. The buffer circuit outputs the gate pulse to the gate line 103 through the output node by means of the pull-up transistor Tu and the pull-down transistor Td.

The buffer circuit supplies the voltage of the shift clocks CLK1 to CLK4 to the output node when the shift clocks CLK1 to CLK4 are inputted while the first control node Q is charged, such that the voltage of the first output node rises to the gate-on voltage VGH, and the first output node is discharged when the second control node QB is charged. Accordingly, the voltage of the gate pulses Gout(n−1) to Gout(n+2) is inverted to the gate-off voltage VGL.

The pull-up transistor Tu includes a gate electrode connected to the first control node Q, a first electrode connected to the CLK node to which one of the shift clocks CLK1 to CLK4 is inputted, and a second electrode connected to the first output node. The pull-down transistor Td includes a gate electrode connected to the second control node QB, a first electrode connected to the first output node, and a second electrode connected to the VSS node to which the gate-off voltage VGL is applied. Although the pull-up transistor Tu and pull-down transistor Td are shown as N-MOS transistor, P-MOS transistors are applicable as well.

An inverter omitted from the drawings may be connected between the first control node Q and the second control node QB. Therefore, when the first control node Q has a high voltage, the second control node QB has a low voltage, and when the first control node Q has a low voltage, the second control node QB has a high voltage.

Each of the signal transfer parts ST(n−1) to ST(n+2) may charge and discharge the first and second control nodes Q and QB using at least one transistor.

As an example, a reset pulse (e.g., from another signal transfer part such as a next signal transfer part) may be inputted to a reset node of the signal transfer parts ST(n−1) to ST(n+2). The signal transfer parts ST(n−1) to ST(n+2) may discharge the first control node Q in response to the reset pulse.

Figure 5:
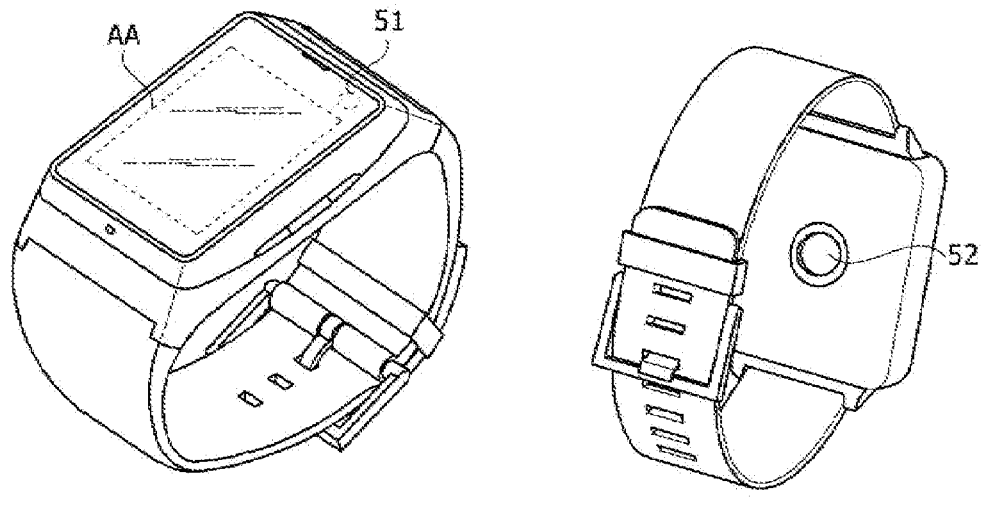
FIG. 5 is a view showing an appearance of a smart watch type wearable device according to an exemplary embodiment of the present disclosure.

FIG. 4 is a block diagram showing a display device according to an exemplary embodiment of the present disclosure. FIG. 5 is a view showing an appearance of a smart watch type wearable device according to an exemplary embodiment of the present disclosure.

Referring to FIGS. 4 and 5, the wearable display device of the present disclosure is connected to a system controller 200, a sensor 210, an input part 220, a communication part 230, an output part 250, an interface part 260, a memory 270, a power supply part 280, and/or the like.

In FIG. 4, a reference numeral "111" denotes a data link part connecting output terminals of a drive IC DIC to input terminals of a demultiplexer array 112. In general, a pitch of input terminals of the demultiplexer array 112 is equal to or greater than a pitch of output terminals of the drive IC DIC. The data link part 111 includes a plurality of conductive wirings (e.g., metal wirings) connecting the output terminals of the drive IC DIC and the input terminals of the demultiplexer array 112, for example, in a 1:1 ratio.

The system controller 200 is connected to the sensor 210, the input part 220, the communication part 230, the output part 250, the interface part 260, the memory 270, and/or the power supply part 280 to control these components.

The sensor 210 includes various sensors other than the touch sensor disposed on the display panel 100. The sensor 210 may include various sensors that sense at least one of surrounding environment information and user information of the wearable display device. The sensor 210 may include a camera 51, a heart rate sensor 52, a proximity sensor, an illumination sensor, an acceleration sensor, a magnetic sensor, a gravity sensor (G-sensor), a gyroscope sensor, motion sensor, a RGB sensor, an infrared sensor, a finger-scan sensor, an ultrasonic sensor, a biometric sensor (fingerprint sensor, iris recognition sensor) and/or the like, but is not limited thereto. The camera 51 may include an image sensor.

The input part 220 may include a microphone, a touch key for user input, a mechanical key, and the like. The communication part 230 may include at least one of a broadcast receiving module (e.g., a circuit), a mobile communication module (e.g., a circuit), a wireless Internet module (e.g., a circuit), a short-distance communication module (e.g., a circuit), and/or a location information module (e.g., a circuit). The output part 250 is for generating an output related to visual, auditory, and/or tactile sensations other than the display panel, and may include an audio output module (e.g., a speaker), a haptic module, an optical output module, and/or the like.

The interface part 260 provides an interface with an external device. The interface part 260 includes at least one of a wired/wireless headset port, an external charger port, a wired/wireless data port, a memory card port, a port connecting a device having an identification module, an audio input/output (I/O) port, a video I/O port, and/or an earphone port, etc.

The memory 270 may store a setting value of the system controller 200, and/or data and commands for controlling an application program or an application. At least some of the application programs may be downloaded or transferred from an external device such as an external server, a PC, a mobile device or another wearable display device, etc. through wireless or wired communication. In addition, at least some of the application programs may be basically stored in the memory when the wearable display device that executes at least basic functions of the application programs is shipped. The basic functions are, for example, a call incoming function, a call outgoing function, a message receiving function, and/or a message sending function, etc.

The power supply part 280 receives an external/internal power and generates a driving power necessary for driving all circuit components necessary for driving the wearable display device. The power supply part 280 may include a battery.

Figure 6:
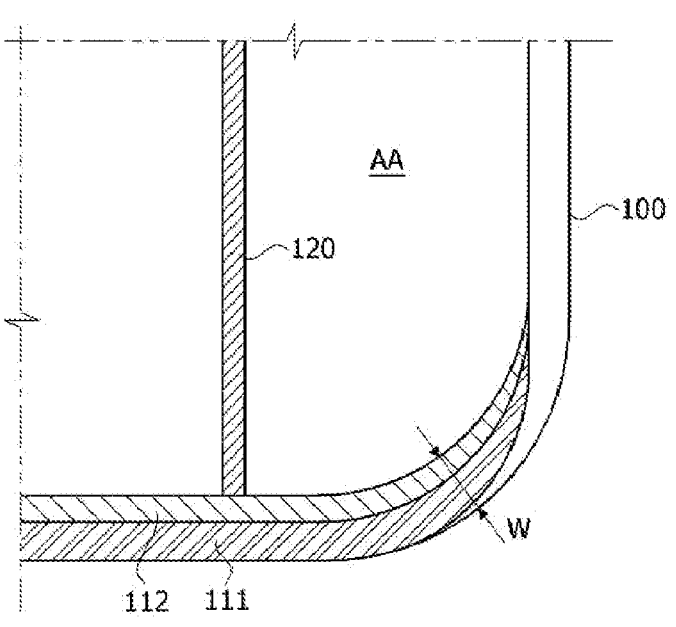
FIG. 6 is an enlarged plan view of a corner part of a display panel according to an embodiment of the present disclosure.

FIG. 6 is an enlarged plan view of a corner part of a display panel according to an exemplary embodiment of the present disclosure.

The gate driver 120 is disposed in the pixel circuit of the display panel 100, and the gate driver 120 is not disposed at a corner part of the display panel 100. As a result, in the corner part of the display panel 100, the width W of the bezel area of the corner part without pixels is reduced. Some wirings of the data link part 111 and/or some switch elements and wirings of the demultiplexer array 112 may be disposed in the bezel area of the corner part of the display panel 100, without being limited thereto.

Figure 7:
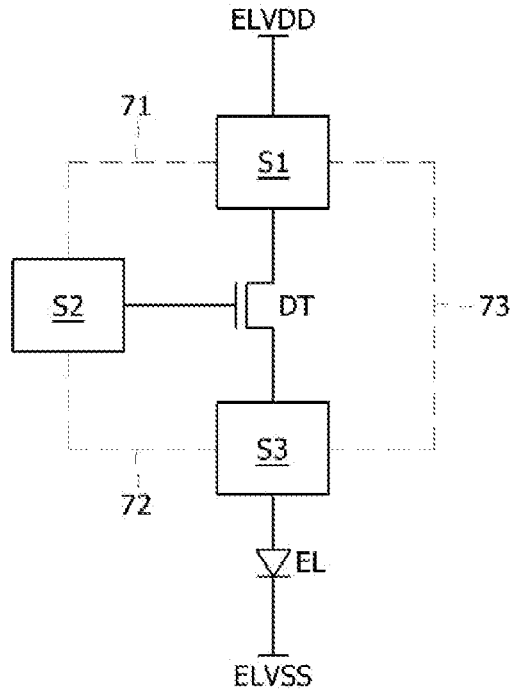
FIG. 7 is a circuit diagram schematically showing a pixel circuit according to an exemplary embodiment of the present disclosure.

FIG. 7 is a circuit diagram schematically showing a pixel circuit according to an exemplary embodiment of the present disclosure.

Referring to FIG. 7, the pixel circuit may include a light emitting element EL, a driving element DT, and circuit parts S1, S2, and S3. At least one of the circuit parts S1, S2, and S3 may include a switch element. In addition, at least one of the circuit parts S1, S2, and S3 may include a capacitor. Each of the switch elements of the circuit parts S1, S2, and S3 and the driving element DT may be implemented as a NMOS and/or PMOS transistor.

The first circuit part S1 supplies a pixel driving voltage ELVDD to the driving element DT. The driving element DT includes a gate electrode, a first electrode, and a second electrode. The second circuit part S2 charges the capacitor connected to a gate electrode of the driving element DT and maintains a voltage of the capacitor for one frame period. The third circuit part S3 provides a current supplied from the pixel driving voltage ELVDD to the light emitting element EL through the driving element DT. The light emitting element EL may emit light by being driven depending on the current supplied from the driving element DT. A first connection part 71 connects the first circuit part S1 and the second circuit part S2. A second connection part 72 connects the second circuit part S2 and the third circuit part S3. A third connection part 73 connects the third circuit part S3 and the first circuit part S1.

As an example, at least one of the circuit parts S1, S2, and S3 may include an internal compensation circuit. The internal compensation circuit may sense a threshold voltage Vth of the driving element DT and compensate for the data voltage of the pixel data by the threshold voltage by applying an internal compensation technique.

Figure 8:
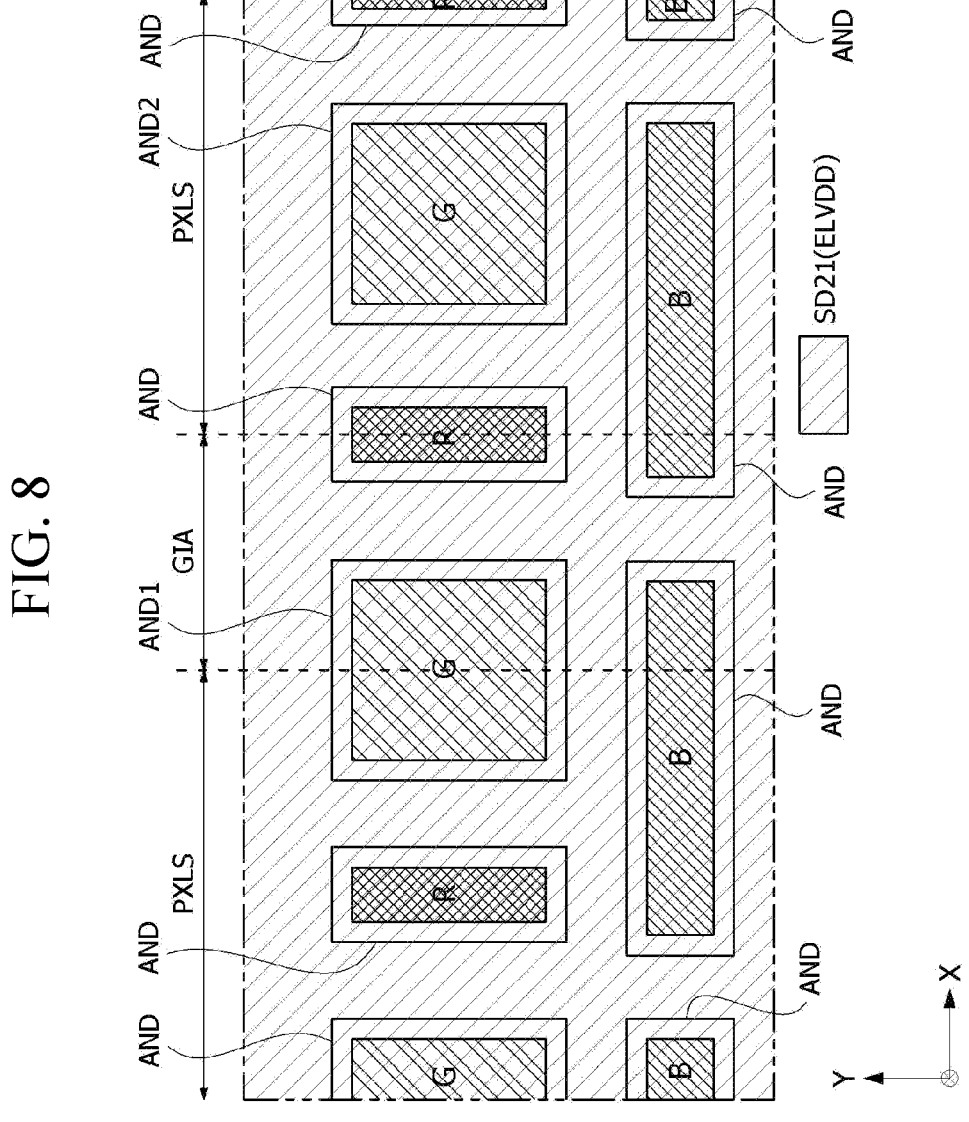
FIG. 8 is an enlarged plan view of a portion of a display panel according to one exemplary embodiment of the present disclosure.
Figure 9:
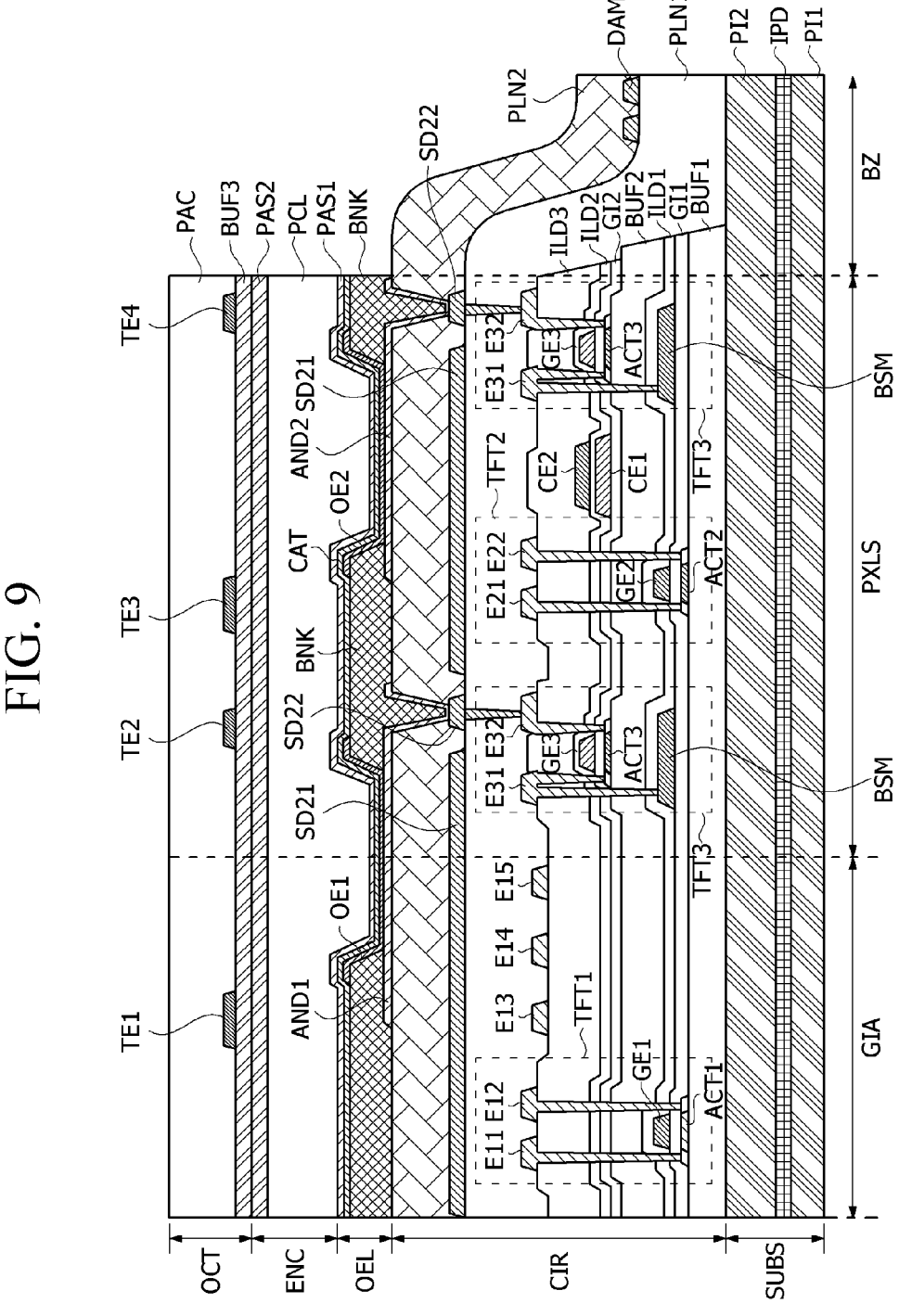
FIG. 9 is a cross-sectional view showing a cross-sectional structure of a pixel circuit area and a gate driving circuit area shown in FIG. 8 according to an exemplary embodiment of the present disclosure.

FIG. 8 is an enlarged plan view of a portion of the display panel 100 according to an exemplary embodiment of the present disclosure. FIG. 9 is a cross-sectional view showing cross-sectional structures of a pixel circuit area PXLS and a gate driving circuit area GIA shown in FIG. 8 according to an exemplary embodiment of the present disclosure. In FIG.

8, "AND", "AND1", and "AND2" denote anode electrodes of the light emitting element EL. In FIG. 9, "BZ" is a bezel area BZ, which is a non-display area without pixels in the display panel 100. "TFT1" is one transistor among transistors constituting the gate driver 120. As an example, the first TFT TFT1 may be at least one of the pull-up transistor Tu and the pull-down transistor Td, and transistors for charging and discharging the first and second control nodes Q and QB of each signal transfer part. "TFT2" is a second TFT that is one of the TFTs disposed in the pixel circuit area PXLS. As an example, the second TFT may be a LTPS TFT. "TFT3" is a third TFT that is one of the TFTs disposed in the pixel circuit area PXLS. As an example, the third TFT may be an oxide TFT.

Referring to FIGS. 8 and 9, in the pixel circuit area PXLS of the display panel, a plurality of sub-pixel circuits and wirings connected to the pixel circuits may be disposed. The pixel circuits in the pixel circuit area may include a pixel circuit of a red sub-pixel driving a red light emitting element, a pixel circuit of a green sub-pixel driving a green light emitting element, and a pixel circuit of a blue sub-pixel driving a blue light emitting element. But embodiments are not limited thereto. As an example, at least one of the pixel circuit of the red sub-pixel, the pixel circuit of the green sub-pixel and the pixel circuit of the blue sub-pixel may be omitted. As another example, the pixel circuits in the pixel circuit area may further include a pixel circuit of a sub-pixel driving a light emitting element of another color other than red, green and blue. The pixel circuit area PXLS is divided into a plurality of circuit areas along the X-axis direction of the display panel within the pixel array AA.

The gate driving circuit area GIA is disposed between circuit areas of the pixel circuit area PXL separated in the X-axis direction within the pixel array AA of the display panel. The gate driving circuit area GIA may be divided into circuit areas spaced at a predetermined interval in the pixel array of the display panel in the X-axis direction. N (N is a positive integer larger than 0. As an example, N may be between 1 and 50 or 10 and 20) sub-pixels in this same line may be disposed between circuit areas of the gate driving circuit area GIA adjacent in the X-axis direction.

Figure 10:
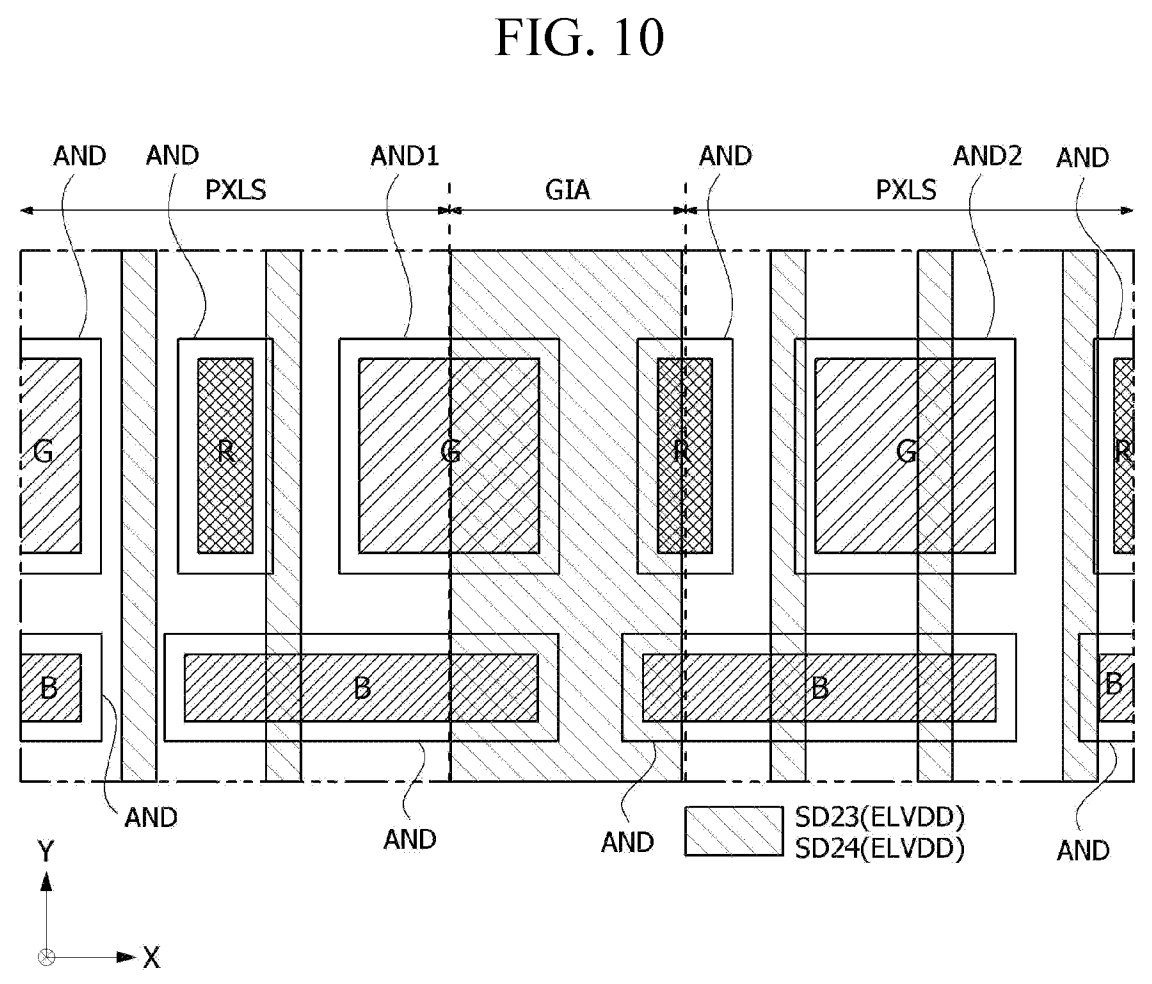

Light emitting areas of sub-pixels are disposed in both the pixel circuit area PXLS and the gate driving circuit area GIA. In FIG. 8, "R" is a red light emitting area in which red light is emitted from the red sub-pixel. "G" is a green light emitting area in which green light is emitted from the green sub-pixel. "B" is a blue light emitting area in which blue light is emitted from the blue sub-pixel. The light emitting area of each color is defined by, for example, a bank pattern BNK shown in FIG. 9. A light emitting area of at least one light emitting element may be disposed between the gate driving circuit area and the pixel circuit area. For example, at the Y-axis direction boundary line between the pixel circuit area PXLS and the gate driving circuit area GIA as shown in FIGS. 8 and 10, the red light emitting area R, the green light emitting area G, and/or the blue light emitting area B may be overlapped.

The display panel may include at least a circuit layer CIR, a light emitting element layer OEL, an encapsulation layer ENC, and a touch sensor layer OCT stacked on a substrate SUBS, as shown in FIG. 9, without being limited thereto. As an example, the touch sensor layer OCT may be omitted.

The substrate SUBS may be a transparent substrate or an opaque substrate. As an example, the substrate SUBS may be a transparent glass or plastic substrate. As another example, the substrate SUBS may be a rigid substrate such as a metal foil. For example, the substrate SUBS may be single layer or multi-layers structure in which organic material layer and inorganic material layer are stacked alternatively. For example, the substrate SUBS may be fabricated with a structure in which a first polyimide (hereinafter referred to as "PI") substrate PI1, an inorganic film IPD, and a second PI substrate PI2 are stacked, without being limited thereto. The inorganic film IPD may block or reduce moisture permeation. For example, the polyimide substrate PI1 and PI2 may be made of any one of polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), or ciclic-olefin copolymer, cyclic olefin copolymer (COC), triacetylcellulose (TAC) film, polyvinyl alcohol (PVA) film, and polystyrene (PS).

The circuit layer CIR includes a pixel circuit, the gate driver 120, the demultiplexer array 112, and/or the like.

A first buffer layer BUF1 may be optionally formed on the second PI substrate PI2. The first buffer layer BUF1 may be formed of a single layer insulating film or a multi-layered insulating film in which two or more oxide layers $SiO_2$ and nitride layers SiNx are stacked. A first semiconductor layer is formed on the first buffer layer BUF1. The first semiconductor layer may include a semiconductor layer (e.g., a polysilicon semiconductor layer or an oxide semiconductor layer) patterned, for example, in a photolithography process. For example, the first semiconductor layer may include polysilicon active patterns ACT1 and ACT2 forming semiconductor channels in the first and second TFTs TFT1 and TFT2.

A first gate insulating layer GI1 is deposited on the first buffer layer BUF1 to cover the active patterns ACT1 and ACT2 of the first semiconductor layer. The first gate insulating layer GI1 includes an inorganic insulating material layer, without being limited thereto. For example, the first gate insulating layer GI1 may include SiOx or SiNx. A first conductive layer such as a first metal layer is formed on the first gate insulating layer GI1. The first metal layer is insulated from the first semiconductor layer by the first gate insulating layer GI1. For example, the first metal layer may be made of any one of include molybdenum (Mo), aluminum (Al), chromium (Cr), gold (Au), titanium (Ti), nickel (Ni), neodymium (Nd), or copper (Cu) or an alloy thereof, but the present disclosure is not limited thereto.

The first metal layer includes a single metal layer patterned, for example, in a photolithography process or metal patterns in which two or more metal layers are stacked. The first metal layer may include gate electrodes GEL and GE2 of the first and second TFTs TFT1 and TFT2 and optionally a light shield pattern BSM below the third TFT TFT3.

A first interlayer insulating layer ILD1 is formed on the first gate insulating layer GI to cover the patterns of the first metal layer. The first interlayer insulating layer ILD1 includes an inorganic insulating material, without being limited thereto. A second buffer layer BUF2 is formed on the first interlayer insulating layer ILD1. The second buffer layer BUF2 includes a single layer or a multi-layer inorganic insulating material, without being limited thereto.

The second semiconductor layer includes a semiconductor pattern (e.g., an oxide semiconductor pattern) ACT3 forming a semiconductor channel in the third TFT TFT3. The second gate insulating layer GI2 is deposited on the second buffer layer BUF2 to cover the active pattern ACT3 of the second semiconductor layer. The second gate insulating layer GI2 includes a single or multi-layered inorganic insulating material, without being limited thereto. A second metal layer is formed on the second gate insulating layer GI2. The second metal layer is insulated from the second semiconductor layer by the second gate insulating layer GI2.

The second metal layer includes a single metal layer patterned, for example, in a photolithography process or metal patterns in which two or more metal layers are stacked. The second metal layer includes a gate electrode GE3 of the third TFT TFT3 and optionally a lower capacitor electrode CE1.

A second interlayer insulating layer ILD2 is formed on the second gate insulating layer GI2 to cover the patterns of the second metal layer. The second interlayer insulating layer ILD2 includes a single layer or a multi-layer inorganic insulating material, without being limited thereto. A third metal layer is formed on the second interlayer insulating layer ILD2. The third metal layer is insulated from the second metal layer by the second interlayer insulating layer ILD2.

The third metal layer includes a single metal layer patterned, for example, in a photolithography process or metal patterns in which two or more metal layers are stacked. The third metal layer includes an upper capacitor electrode CE2. The capacitor Cst of the pixel circuit includes the upper capacitor electrode CE2, the lower capacitor electrode CE1, and a dielectric layer therebetween, that is, the second interlayer insulating layer ILD2.

A third interlayer insulating layer ILD3 covering the patterns of the third metal layer is formed on the second interlayer insulating layer ILD2. The third interlayer insulating layer ILD3 includes a single layer or a multi-layer inorganic insulating material, without being limited thereto. A fourth metal layer is formed on the third interlayer insulating layer ILD3. The fourth metal layer is insulated from the third metal layer by the third interlayer insulating layer ILD3.

The fourth metal layer includes a single metal layer patterned, for example, in a photolithography process or metal patterns in which two or more metal layers are stacked. The fourth metal layer includes first and second electrodes E11 and E12 of the first TFT TFT1, first and second electrodes E21 and E22 of the second TFT TFT2, and first and second electrodes E31 and E32 of the third TFT TFT3, without being limited thereto. As an example, these electrodes may also be formed on different layers. The first and second electrodes E11 and E12 of the first TFT TFT1 are connected to the first active pattern ACT1 through a first contact hole penetrating the insulating layers GI1, ILD1, BUF2, GI2, ILD2, and ILD3. A shift clock may be applied to one of the first and second electrodes E11 and E12 of the first TFT TFT1. The first and second electrodes E21 and E22 of the second TFT TFT2 are connected to the second active pattern ACT2 through a second contact hole penetrating the insulating layers GI1, ILD1, BUF2, GI2, ILD2, and ILD3. The first and second electrodes E31 and E32 of the third TFT TFT3 are connected to the third active pattern ACT3 through a third contact hole penetrating the insulating layers GI2, ILD2 and ILD3. The first electrode E31 of the third TFT TFT3 may be connected to the light shield pattern BSM through a fourth contact hole penetrating the insulating layers ILD1, BUF2, GI2, ILD2, and ILD3.

The fourth metal layer includes main nodes of the gate driver 120 shown in FIG. 3. The fourth metal layer includes a metal pattern E13 connected to a first control node Q, a metal pattern E14 connected to a first output node from which the gate pulse is outputted, a metal pattern E15 connected to a second control node QB, and/or the like. In this case, as an example, light emitting areas of sub-pixels may overlap with at least one of metal patterns E11 to E15. As another example, the anode electrode AND1 may overlap with at least one of metal patterns E11 to E15.

A first planarization layer PLN1 covers the patterns E11 to E32 of the fourth metal layer. The first planarization layer PLN1 is an organic insulating material and thickly covers the pixel circuit area PXLS and the gate driving circuit area GIA of the circuit layer 12. When the first planarization layer PLN is applied on the circuit layer 12, the organic insulating material flows to the edge of the display panel 100 and covers a side surface of the circuit layer 12 in the bezel area BZ.

A fifth metal layer is formed on the first planarization layer PLN1. The fifth metal layer is insulated from the fourth metal layer by the first planarization layer PLN1. The fifth metal layer includes a single metal layer patterned, for example, in a photolithography process or metal patterns in which two or more metal layers are stacked. The fifth metal layer includes a power line SD21 to which the pixel driving voltage ELVDD is applied and/or a metal pattern SD22 connecting the light emitting element EL to the third TFT TFT3, without being limited thereto. As an example, the metal pattern SD22 may be omitted. The power line SD21 and the metal pattern SD22 are spaced apart from each other on the same plane. The power line SD21 is overlapped with the patterns E11 to E31 of the fourth metal layer disposed on a lower portion thereof in the pixel circuit area PXLS and the gate driving circuit area GIA with the first planarization layer PLN1 interposed therebetween. The power line SD21 may be patterned in a mesh shape. The metal pattern SD22 is connected to the second electrode E32 of the third TFT TFT3 through a fifth contact hole penetrating the first planarization layer PLN1. The fifth metal layer may further optionally include a plurality of DAM patterns to suppress a phenomenon in which the organic insulating material flows into the bezel area BZ during the process of applying the second planarization layer PLN2.

A strong electric field may be generated in the metal patterns E11 to E31 of the fourth metal layer due to voltages swinging between a gate-on voltage and a gate-off voltage having a large voltage difference. The power line SD21 of the fifth metal layer is positioned between the metal patterns E11 to E31 of the fourth metal layer and the anode electrodes AND1 and AND2 of the light emitting element EL to block the electric field such that the electric field generated when the voltage applied to the metal patterns of the fourth metal layer is varied does not affect the anode electrodes AND1 and AND2 of the light emitting element EL. In addition, the power line SD21 may increase the degree of flatness of the anode electrodes AND1 and AND2 to improve a difference in light reflection visibility reflected from a metal depending on the viewing angle.

A second planarization layer PLN2 is formed on the first planarization layer PLN1 to cover the metal patterns of the fifth metal layer. The second planarization layer PLN2 is an organic insulating material and thickly covers the pixel circuit area PXLS, the gate driving circuit area GIA, and the bezel area BZ of the circuit layer 12. A sixth metal layer is formed on the second planarization layer PLN2. The second planarization layer PLN2 flattens the surface on which the sixth metal layer is formed. For example, the first planarization layer PLN1 and second planarization layer PLN2 may be formed of one or more materials of acrylic resin, epoxy resin, phenolic resin, polyamides resin, unsaturated polyesters resin, polyphenylene resin, polyphenylene sulfides resin, and benzocyclobutene.

The sixth metal layer includes a single metal layer patterned, for example, in a photolithography process or metal patterns in which two or more metal layers are stacked. The sixth metal layer includes anode electrodes AND1 and AND2 of the light emitting element EL. The anode electrodes AND1 and AND2 are overlapped with the power line SD21 of the fifth metal layer with the second planarization layer PLN2 interposed therebetween. The anode electrodes AND1 and AND2 are in contact with the metal pattern SD22 connected to the third TFT TFT3 of the pixel circuits through a sixth contact hole penetrating the second planarization layer PLN2. The anode electrode AND1 disposed in the gate driving circuit area GIA may be connected to the third TFT TFT3 of the pixel circuit through a sixth contact hole at a portion overlapped with the pixel circuit area PXLS. For example, the anode electrodes AND1 and AND2 may be formed of a transparent conductive material, such as indium tin oxide, indium zinc oxide, or the like.

In the light emitting element layer OEL, a bank pattern BNK is formed on the second planarization layer PLN2 to cover edges of the anode electrodes AND1 and AND2. The bank pattern BNK defines the light emitting areas R, G, and B of each of the sub-pixels in the pixel circuit area PXLS and the gate driving circuit area GIA. The bank pattern BNK may include an insulating material (e.g., a photosensitive organic insulating material) and/or be patterned, for example, in a photolithography process. A spacer pattern having a predetermined height may be optionally formed on the bank pattern BNK. The bank pattern BNK may include an insulating material. As an example, the bank pattern BNK may include an organic insulating material such as acryl resin, epoxy resin, phenolic resin, polyamide resin, and/or polyimide resin, etc. Alternatively, the bank pattern BNK may include an inorganic insulating material such as silicon nitride, aluminum nitride, zirconium nitride, titanium nitride, hafnium nitride, tantalum nitride, silicon oxide, aluminum oxide, or titanium oxide, etc.

Organic compound layers OE1 and OE2 including the light emitting layer are formed in contact with the anode electrodes AND1 and AND2 in each of the light emitting areas R, G, and B of the sub-pixels. The organic compound layers OE1 and OE2 are separated between sub-pixels by the bank pattern BNK.

A seventh metal layer used as a cathode electrode CAT of the light emitting element EL is formed on the bank pattern BNK and the organic compound layers OE1 and OE2. The seventh metal layer is connected between sub-pixels in the pixel circuit area PXLS and the gate driving circuit area GIA. For example, the cathode electrode CAT may be formed of a metal material such as magnesium (Mg), a silver-magnesium alloy or the like. Also, the cathode electrode CAT may be a transparent conductive oxide based on indium tin oxide, indium zinc oxide, indium tin zinc oxide, zinc oxide, tin oxide, or the like.

An encapsulation layer ENC includes multiple insulating layers covering the cathode electrode CAT of the light emitting element EL to reduce or prevent the components in a lower position from being oxidized and/or damaged due to moisture, oxygen, or impurities from the outside. The multiple insulating layers include a first inorganic insulating layer PAS1 covering the cathode electrode CAT, a thick organic insulating layer PCL covering the first inorganic insulating layer PAS1, and a second inorganic insulating layer PAS2 covering the organic insulating layer PCL, such as silicon nitride or aluminum oxide, without being limited thereto.

A touch sensor layer OCT includes a third buffer layer BUF3 covering the second inorganic insulating layer PAS2, sensor electrode wirings TEL to TE4 formed on the third buffer layer BUF3, and an organic insulating layer PAC covering sensor electrode wiring TE1 to TE4, without being limited thereto.

Figure 11:
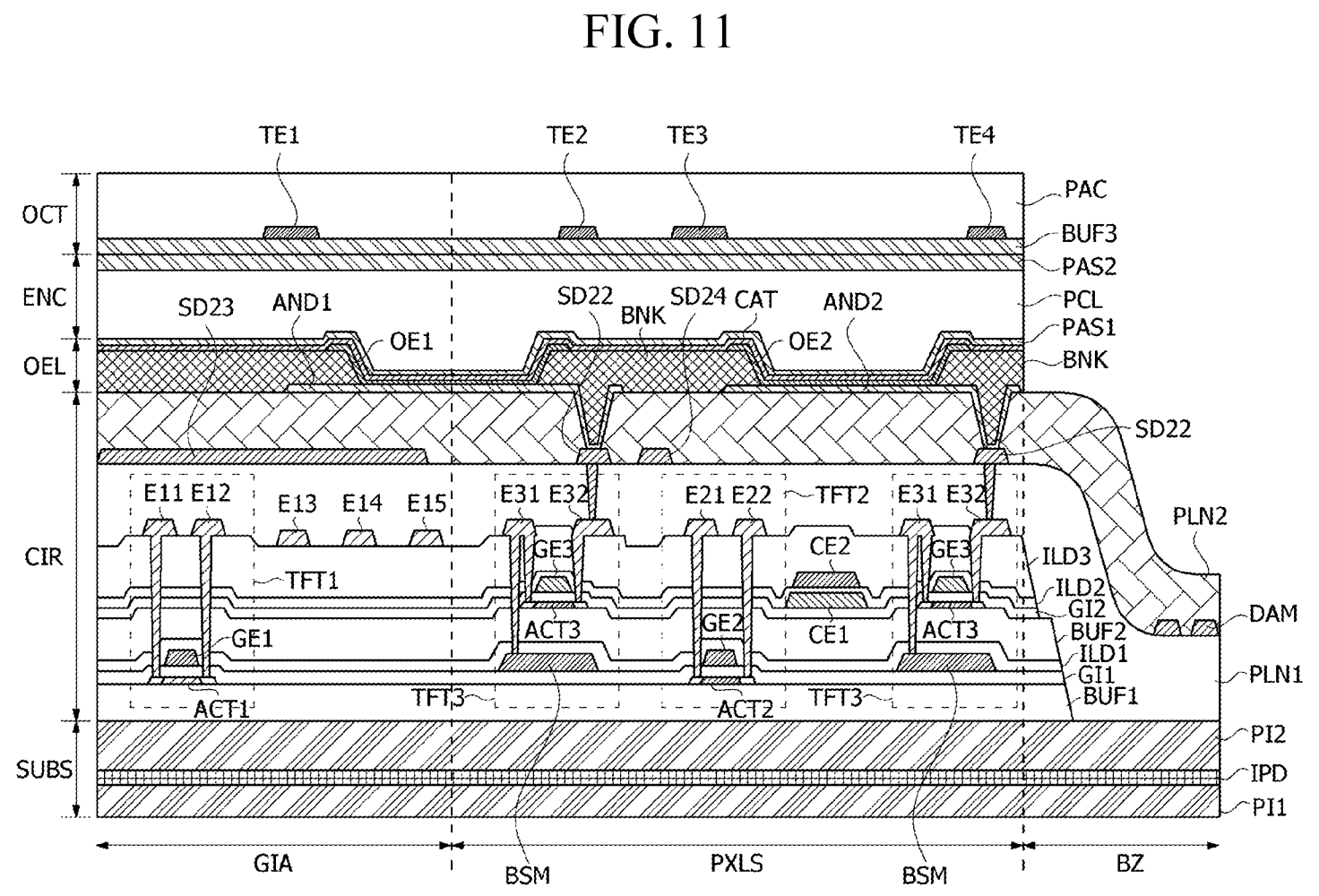

FIG. 10 is an enlarged plan view of a portion of the display panel 100 according to another exemplary embodiment of the present disclosure. FIG. 11 is a cross-sectional view showing cross-sectional structures of the pixel circuit area PXLS and the gate driving circuit area GIA shown in FIG. 10 according to another exemplary embodiment of the present disclosure. In FIGS. 10 and 11, the same reference numerals are given to components substantially the same as those of the above-described embodiment, and detailed descriptions will be omitted.

Referring to FIGS. 10 and 11, a fifth metal layer is formed on the first planarization layer PLN1. The fifth metal layer is insulated from the fourth metal layer by the first planarization layer PLN1. The fifth metal layer includes power lines SD23 and SD24 to which the pixel driving voltage ELVDD is applied, and optionally a metal pattern SD22 connecting the light emitting element EL to the third TFT TFT3. The power lines SD23 and SD23 and the metal pattern SD22 are spaced apart from each other on the same plane.

The power lines SD23 and SD24 includes a first power line SD23 disposed in the gate driving circuit area GIA to be overlapped with the gate driver 120 with the first planarization layer PLN1 interposed therebetween and to be overlapped with the anode electrode AND1 with the second planarization layer PLN2 interposed therebetween, and a second power line SD24 having a line width smaller than that of the first power line SD23 and disposed in the pixel circuit area PXLS to be overlapped with the pixel circuit with the first planarization layer PLN1 interposed therebetween.

The power line SD23 is disposed in the gate driving circuit area GIA along the Y-axis direction. The power line SD23 may be overlapped with at least one of the patterns E11 to E15 of the fourth metal layer disposed on a lower portion thereof in the gate driving circuit area GIA with the first leveling layer PLN1 interposed therebetween. The anode electrode AND1 of the light emitting element EL is overlapped with the first power line SD23 of the fifth metal layer with the second planarization layer PLN2 interposed therebetween. The first power line SD23 blocks the electric field from the fourth metal layer such that the electric field generated from the metal patterns E11 to E15 of the fourth metal layer disposed on the lower portion thereof does not affect the anode electrode AND1 of the light emitting element EL. In addition, the first power line SD23 may increase the degree of flatness of the anode electrode AND1 to improve a difference in light reflection visibility reflected from a metal depending on the viewing angle.

The second power line SD24 disposed in the pixel circuit area PXLS may be patterned as a narrow wiring such that it is not short-circuited with the metal pattern SD22 formed on the same layer as this second power line SD24 and connected to the third TFT TFT3. As shown in FIGS. 8 and 9, when the power line SD21 is widely disposed in the gate driving circuit area GIA and the pixel circuit area PXLS, visibility may be deteriorated due to reflection of an external light on this power line SD21. As shown in FIGS. 10 and 11, the line width of the second power line SD24 disposed in the pixel circuit area PXLS may be reduced, thereby reducing reflection of the external light and uniformly transferring the pixel driving voltage ELVDD to the entire pixel array AA. Meanwhile, in order to further reduce reflection of the external light, the second power line SD24 disposed in the pixel circuit area PXLS may be omitted.

The power line SD23 of the fifth metal layer is positioned between the metal patterns E11 to E15 of the fourth metal layer and the anode electrode AND1 of the light emitting element EL to block the electric field such that the electric field generated when the voltage applied to the metal patterns E11 to E15 of the fourth metal layer is varied does not affect the anode electrode AND1 of the light emitting element EL. In addition, the power line SD23 of the fifth metal layer may increase the degree of flatness of the anode electrode AND1 to improve a difference in light reflection visibility reflected from a metal depending on the viewing angle.

The order of the stacked layers is illustrated in an illustrative way, and thereby may be changed in various way as necessary. In addition, at least one of the stacked layers could be omitted as necessary.

Although most of the specification is described in the scenario of a wearable display devices, embodiments of the present disclosure are not limited thereto. As an example, the display panel according to embodiments of the present disclosure may also be applied in any other display devices such as mobile apparatuses, video phones, electronic organizers, electronic book, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:
1. A display panel comprising:
a pixel array including:
a pixel circuit area including a plurality of pixel circuits connected to data lines, gate lines, and power lines; and
a gate driving circuit area including a gate driver configured to supply a gate signal to the gate lines, and wherein a light emitting area of a light emitting element driven by the plurality of pixel circuits is in the pixel circuit area and the gate driving circuit area, and the power lines are below an anode electrode of the light emitting element, wherein the gate driving circuit area is disposed between the pixel circuit area of the plurality of pixel circuits separated in a first direction in which the gate lines extend.

2. The display panel according to claim 1, wherein the light emitting area of the light emitting element is between the gate driving circuit area and the pixel circuit area.

3. The display panel according to claim 1, further comprising:

a first planarization layer configured to cover the gate driver and the plurality of pixel circuits; and a second planarization layer configured to cover the first planarization layer, wherein the power line is overlapped with the gate driver and the plurality of pixel circuits with the first planarization layer interposed therebetween, and the power line is overlapped with the anode electrode with the second planarization layer interposed therebetween.

4. The display panel according to claim 3, further comprising:

a metal pattern connected to a transistor of the pixel circuits through a contact hole penetrating the first planarization layer and connected to the anode electrode through a contact hole penetrating the second planarization layer, wherein the power line and the metal pattern are spaced apart from each other on the first planarization layer.

5. The display panel according to claim 3, wherein each of signal transfer parts of the gate driver includes a first control node connected to a gate electrode of a pull-up transistor, a second control node connected to a gate electrode of a pull-down transistor, and an output node connected to the gate line, the first planarization layer covers the first control node, the second control node, and the output node, and the power line is overlapped with at least one of the first control node, the second control node, and the output node with the first planarization layer interposed therebetween in the gate driving circuit area.

6. The display panel according to claim 1, further comprising:

a first planarization layer configured to cover the gate driver and the plurality of pixel circuits; and a second planarization layer configured to cover the first planarization layer, wherein the power line includes:

a first power line in the gate driving circuit area, overlapped with the gate driver with the first planarization layer interposed therebetween, and overlapped with the anode electrode with the second planarization layer interposed therebetween, and a second power line disposed in the pixel circuit area and overlapped with the plurality of pixel circuits with the first planarization layer interposed therebetween.

7. The display panel according to claim 6, wherein the second power line has a line width that is smaller than a line width of the first power line.

8. The display panel according to claim 6, wherein each of signal transfer parts of the gate driver includes a first control node connected to a gate electrode of a pull-up transistor, a second control node connected to a gate electrode of a pull-down transistor, and an output node connected to the gate line, and the first planarization layer covers the first control node, the second control node, and the output node, and the first power line is overlapped with at least one of the first control node, the second control node, and the output node with the first planarization layer interposed therebetween in the gate driving circuit area.

9. The display panel according to claim 1, wherein at least one pixel is disposed between gate driving circuit areas adjacent to each other in the first direction.

10. The display panel according to claim 1, wherein an anode of the light emitting element is overlapped with the gate driver with the power line interposed therebetween.

11. The display panel according to claim 1, wherein the light emitting area of the light emitting element is overlapped with the gate driver with the power line interposed therebetween.

12. The display panel according to claim 1, wherein each of signal transfer parts of the gate driver includes a first control node connected to a gate electrode of a pull-up transistor, a second control node connected to a gate electrode of a pull-down transistor, an output node connected between the pull-up transistor and the pull-down transistor and connected to the gate line, and at least one transistor configured to charge or discharge the first control node and the second control node, and wherein at least one of the first control node, the second control node, the output node, the pull-up transistor, the pull-down transistor and the at least one transistor is overlapped with the anode electrode of the light emitting element.

13. The display panel according to claim 12, wherein at least one of the first control node, the second control node, the output node, the pull-up transistor, the pull-down transistor and the at least one transistor is overlapped with the light emitting area of the light emitting element.

14. The display panel according to claim 12, wherein at least one of the first control node, the second control node, the output node, the pull-up transistor, the pull-down transistor and the at least one transistor is overlapped with the anode electrode of the light emitting element with the power line interposed therebetween.

15. The display panel according to claim 14, wherein the power line is overlapped with the first control node, the second control node, the output node, the pull-up transistor, the pull-down transistor and the at least one transistor while extending in a second direction perpendicular with the first direction in which the gate lines extend.

16. The display panel according to claim 1, further comprising:

a demultiplexer array connected to the data lines; and a data link part connected to an input terminal of the demultiplexer, wherein the demultiplexer array and the data link part are at a corner part of the display panel without the gate driver.

17. A display device comprising:

a display panel including a pixel circuit area in which a plurality of pixel circuits connected to a data line, a gate line, and a power line are disposed, a gate driving circuit area in which a gate driver configured to supply a gate signal to the gate line is disposed, and a demultiplexer array connected to the data line, and a data link part connected to an input terminal of the demultiplexer; and a drive integrated circuit (IC) connected to the data link part and the gate driver, wherein a light emitting area of a light emitting element driven by the plurality of pixel circuits is in the pixel circuit area and the gate driving circuit area, and the power line is below an anode electrode of the light emitting element.

18. The display device according to claim 17, further comprising:

a first planarization layer configured to cover the gate driver and the plurality of pixel circuits; and a second planarization layer configured to cover the first planarization layer, wherein the power line is overlapped with the gate driver and the plurality of pixel circuits with the first planarization layer interposed therebetween, and is overlapped with the anode electrode with the second planarization layer interposed therebetween.

19. The display device according to claim 17, further comprising:

a first planarization layer configured to cover the gate driver and the plurality of pixel circuits; and a second planarization layer configured to cover the first planarization layer, wherein a first power line disposed in the gate driving circuit area, overlapped with the gate driver with the first planarization layer interposed therebetween, and overlapped with the anode electrode with the second planarization layer interposed therebetween, and a second power line having a line width that is smaller than a line width of the first power line and disposed in the pixel circuit area and overlapped with the plurality of pixel circuits with the first planarization layer interposed therebetween.

* * * * *